US005895955A

United States Patent [19]
Gardner et al.

[11] Patent Number: 5,895,955
[45] Date of Patent: Apr. 20, 1999

[54] MOS TRANSISTOR EMPLOYING A REMOVABLE, DUAL LAYER ETCH STOP TO PROTECT IMPLANT REGIONS FROM SIDEWALL SPACER OVERETCH

[75] Inventors: Mark I. Gardner, Cedar Creek; Fred N. Hause; H. Jim Fulford, Jr., both of Austin, all of Tex.

[73] Assignee: Advanced Micro Devices, Inc.

[21] Appl. No.: 08/781,451

[22] Filed: Jan. 10, 1997

[51] Int. Cl.$^6$ ............................................. H01L 29/72
[52] U.S. Cl. .................. 257/336; 257/344; 257/401; 257/408; 438/163; 438/184; 438/230; 438/514; 438/694
[58] Field of Search ............................ 257/336, 344, 257/401, 408; 438/163, 184, 230, 514, 694

[56] References Cited

U.S. PATENT DOCUMENTS

| | | |
|---|---|---|
| 4,172,260 | 10/1979 | Okabe et al. |
| 4,463,491 | 8/1984 | Goldman et al. |
| 4,652,897 | 3/1987 | Okuyama et al. |
| 4,672,419 | 6/1987 | McDavid |
| 4,737,828 | 4/1988 | Brown |
| 4,788,663 | 11/1988 | Tanaka et al. |
| 4,818,715 | 4/1989 | Chao |
| 4,843,023 | 6/1989 | Chiu et al. |
| 4,868,617 | 9/1989 | Chiao et al. |
| 4,949,136 | 8/1990 | Jain |
| 4,951,100 | 8/1990 | Parrillo |
| 4,952,825 | 8/1990 | Toshida |
| 4,968,639 | 11/1990 | Bergonzoni |
| 4,994,404 | 2/1991 | Sheng et al. |
| 5,015,598 | 5/1991 | Verhaar |
| 5,091,763 | 2/1992 | Sanchez |
| 5,153,145 | 10/1992 | Lee et al. |
| 5,168,072 | 12/1992 | Moslehi |
| 5,216,268 | 6/1993 | Chen et al. |
| 5,241,203 | 8/1993 | Hsu et al. |

(List continued on next page.)

FOREIGN PATENT DOCUMENTS

| | | |
|---|---|---|
| 58-137255 | 8/1983 | Japan. |
| 62-200757 | 9/1987 | Japan. |
| 63-161660 | 7/1988 | Japan. |
| 2-280342 | 11/1990 | Japan. |
| 3-41773 | 2/1991 | Japan. |
| 4-85968 | 3/1992 | Japan. |
| 4-171730 | 6/1992 | Japan. |
| 4-208571 | 7/1992 | Japan. |
| 5-75115 | 3/1993 | Japan. |
| 5-129325 | 5/1993 | Japan. |
| 5-267327 | 10/1993 | Japan. |

OTHER PUBLICATIONS

Wolf et al., *Silicon Processing for the VLSI Era, vol. 1:Process Technology*, Lattice Press 1986, p. 183.

Primary Examiner—Edward Wojciechowicz
Attorney, Agent, or Firm—Kevin L. Daffer; Conley, Rose & Tayon

[57] ABSTRACT

A transistor and transistor fabrication method are presented where a sequence of layers are formed and either entirely or partially removed upon sidewall surfaces of a gate conductor. The formation and removal of layers produces a series of laterally spaced surfaces to which various implants can be aligned. Those implants, placed in succession produce a highly graded junction having a relatively smooth doping profile. The multilayer spacer structure comprises a polysilicon spacer interposed between a grown oxide and an etch stop. The polysilicon spacer is formed by an anisotropic etch, and the pre-existing etch stop prevents the anisotropic etch from damaging the source/drain and gate conductor regions beneath the etch stop. Further, the etch stop allows removal of the overlying oxide as well as the entire polysilicon during times when the multi-layer spacer is entirely removed. Removal of the various layers does not damage the underlying substrate due to the presence of the etch stop. The etch stop preferably comprises a nitride layer overlying an oxide layer, wherein the oxide layer can either be deposited or grown.

24 Claims, 4 Drawing Sheets

U.S. PATENT DOCUMENTS

| | | |
|---|---|---|
| 5,258,319 | 11/1993 | Inuishi et al. . |
| 5,274,261 | 12/1993 | Chen . |
| 5,324,974 | 6/1994 | Liao . |
| 5,332,914 | 7/1994 | Hazani . |
| 5,334,870 | 8/1994 | Katada et al. . |
| 5,371,394 | 12/1994 | Ma et al. . |
| 5,386,133 | 1/1995 | Hiroki et al. . |
| 5,405,791 | 4/1995 | Ahmed et al. . |
| 5,422,506 | 6/1995 | Zamapian . |
| 5,444,282 | 8/1995 | Yamaguchi et al. . |
| 5,473,184 | 12/1995 | Murai . |
| 5,477,070 | 12/1995 | Nam . |
| 5,498,555 | 3/1996 | Lin . |
| 5,608,240 | 3/1997 | Kumagai . |
| 5,663,586 | 9/1997 | Lin . |
| 5,719,425 | 2/1998 | Akram et al. ............................. 257/408 |
| 5,766,969 | 6/1998 | Fulford, Jr. et al. . |
| 5,793,089 | 8/1998 | Fulford, Jr. et al. . |
| 5,837,572 | 11/1998 | Gardner et al. . |

MOS TRANSISTOR EMPLOYING A REMOVABLE, DUAL LAYER ETCH STOP TO PROTECT IMPLANT REGIONS FROM SIDEWALL SPACER OVERETCH

BACKGROUND OF THE INVENTION

1. Field of the Invention

This invention relates to semiconductor processing and, more particularly, to a method of forming and removing spacer layers upon and from, respectively, sidewall surfaces of a gate conductor and substrate proximate to the gate conductor. An etch stop layer formed upon the gate conductor and substrate serve to protect, during spacer formation, against overetch of the gate conductor and substrate.

2. Description of Related Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well recognized LOCOS technique.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal annealer ("RTA"). A gate conductor material is then deposited across the entire dielectric-covered substrate. The gate conductor material is preferably polycrystalline silicon, or polysilicon. The polysilicon layer is then patterned using a photolithography mask. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

The patterned gate conductor material, if polysilicon, is rendered conductive with the introduction of ions from an implanter or a diffusion furnace. Depending on the implant species forwarded into the gate conductor, either an n-channel transistor (NMOS transistor) or a p-channel transistor (PMOS transistor) is formed. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and a distance between junction regions is typically referred to as the physical channel length. After implantation and subsequent diffusion of the junction regions, the distance between the junction regions becomes less than the physical channel length and is often referred to as the effective channel length ("Leff"). In high density designs, not only does the physical channel length become small so too must the Leff. As Leff decreases below approximately 1.0 µm, for example, a problem known as short channel effects ("SCE") becomes predominant.

A problem related to SCE, and the subthreshold currents associated therewith, but altogether different is the problem of hot-carrier effects ("HCE"). HCE is a phenomenon by which hot-carriers ("holes and electrons") arrive at or near an electric field gradient. The electric field gradient, often referred to as the maximum electric field ("Em") occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 µm.

Unless modifications are made to the process in which relatively small transistors are formed, problems with subthreshold current and threshold shift resulting from SCE and HCE will remain. To overcome these problems, alternative drain structures such as double-diffused drain ("DDD") and lightly doped drain ("LDD") structures must be used. The purpose of both types of structures is the same: to absorb some of the potential into the drain and thus reduce Em. The popularity of DDD structures has given way to LDD structures since DDD causes unacceptably deep junctions and deleterious junction capacitance.

A conventional LDD structure is one whereby a light concentration of dopant is self-aligned to the edge of the gate conductor. The light-dopant concentration is then followed by a heavier-dopant concentration which is self-aligned to a spacer formed on the sidewalls of the gate conductor. The purpose of the first implant dose is to produce a lightly doped section of both the source and drain junction areas at the gate edge near the channel. The second implant dose is spaced from the channel a distance dictated by the thickness of the sidewall spacer. Resulting from the first and second implants, a dopant gradient occurs across the junction from the source/drain area of the junction to the LDD area adjacent the channel.

A properly defined LDD structure is one which introduces a light concentration of dopants so as to minimize the abruptness in voltage changes near the drain side of the channel. Dispersing abrupt voltage changes reduces Em strength and the harmful hot-carrier effects resulting therefrom. A need therefore exists for producing a gradual doping profile for the purpose of dispersing Em within the drain junction. A spacer is preferably used to achieve this end by distributing the source/drain implant away from the channel area, leaving a lighter doped LDD implant between the source/drain region and the channel region. Unfortunately, the anisotropic etch needed to form the spacer jeopardizes the integrity of the source/drain area as well as the gate conductor upper surface. Anisotropic etching dictates that ions bombard the source/drain surface in order to remove unwanted spacer material from that surface. The ions, however, are charged and impart corresponding charge to the source/drain. Further, the accelerated ions impinge on the source/drain causing "pitting" of the substrate surface. Charging or pitting of the substrate surface, if left unprotected during the anisotropic etch, is undesirable since it imparts a change in the electrical performance of the gate conductor as well as the source/drain junctions. An advance in conventional processing would dictate a desire to utilize an etch stop protectant beneath the spacer and specifically beneath regions to be removed of spacer material. A properly designed protectant would minimize charging and/or pitting of the source/drain, and the problems associated therewith.

SUMMARY OF THE INVENTION

The problems outlined above are in large part solved by an integrated circuit and integrated circuit fabrication method hereof The present structure and method employ a multi-layer spacer structure formed upon an etch stop protectant layer. The multi-layer spacer comprises an interim layer which can serve to mask align the lateral edges of a plurality of separate implant steps. The interim layer preferably comprises polysilicon which, after deposition and subsequent partial removal, serves as a mask for two separate implants. The deposited polysilicon provides masking for a first implant. However, after growth of an overlying layer, the polysilicon layer is partially consumed. The consumed polysilicon material can then be removed with the overlying grown material so the resulting, partially retained polysilicon serves as a mask for another implant. Accordingly, the polysilicon serves to mask two implants, a first implant after polysilicon is deposited and a second implant after a portion of the polysilicon is removed.

The polysilicon layer within the multi-layer spacer structure beneficially minimizes the number of deposition steps needed to form the spacer structure. For example, instead of requiring three deposition steps to form three distinct lateral masking surfaces, the present process requires only one deposition step followed by a growth/removal cycle. A combination of polysilicon and grown oxide serves as a source/drain implant mask, and the polysilicon layer serves as a medium doped drain ("MDD") implant mask. However, a further benefit is achieved when the grown oxide is removed from the polysilicon. As the oxide is removed, polysilicon consumed during oxide growth will also be removed. This removal step is highly selective to oxide as opposed to underlying polysilicon. The result is a newly defined lateral surface which can then be used to mask another MDD implant laterally offset from the previous MDD implant. Accordingly, use of polysilicon and an overlying grown oxide which is sacrificial serves to produce three separate and distinct lateral masking surfaces. Those surfaces are produced by a single deposition step involving polysilicon, followed by thermal exposure in oxygen, followed by oxide etch. As such only one time-consumptive chemical vapor deposition ("CVD") cycle is needed to bring about potentially three junction implants having one lateral surface displaced from each of the other two.

The interim polysilicon layer of the multi-layer sidewall structure is interposed between an etch stop and an oxide layer. The etch stop exists entirely across a topography comprising gate conductors and substrate between gate conductors. The polysilicon spacer material is placed across the etch stop, and thereafter selectively removed. More specifically, the polysilicon material is removed by an ion-assisted, plasma etch technique employing ions directed substantially perpendicular to the substrate surface. The combination of ions and chemical etchant clears polysilicon from substantially horizontal surfaces of the etch stop but retains material on vertical surfaces. The material retained on opposing sidewall surfaces of the gate conductor is deemed a polysilicon spacer.

The etch stop preferably comprises two separate layers. A silicon nitride layer exists over an oxide layer, and the oxide layer exists over the gate conductor exposed surfaces and the silicon substrate between gate conductors. The oxide and overlying nitride are formed at specific thicknesses preferably within the ratio of approximately oxide:nitride of 1:2. The oxide can either be deposited or grown to a thickness sufficient to buffer mechanical stress between the underlying silicon/polysilicon and the overlying nitride. The nitride is deposited on the oxide to a thickness sufficient to absorb any and all overetch associated with polysilicon spacer and/or oxide removal. Accordingly, the nitride comprises a chemical and mechanical composition which etches at a substantially slower rate than the overlying polysilicon (and oxide grown on polysilicon spacer). Thus, plasma etching necessary to form the polysilicon spacer, and to remove oxide from the spacer, does not etch through the nitride of the layered etch stop. Accordingly, the presence of nitride and the underlying pad oxide serve to maintain the mechanical and electrical integrity of the underlying source/drain regions and the gate conductor.

The etch stop benefits as being possibly another layer of the multi-layer spacer structure and, accordingly, yet another lateral masking surface to which an MDD implant may align. According to one embodiment, the multi-layer structure which includes the etch stop is first formed, and then each layer is removed selectively from the underlying layer. Prior to removing the first layer, a source/drain implant occurs within the junction regions using the entire multi-layer spacer. Thereafter, each layer is removed in succession followed by a corresponding implant of lesser energy and lesser concentration than the source/drain implant. The result of successive removal and interim implants is to produce a highly graded junction. The polysilicon spacer interposed between an overlying oxide and the underlying etch stop is removed in two steps: the first step occurring through oxide removal of a partially consumed polysilicon and last occurring through an entire polysilicon strip. The oxide consumption is restricted entirely to the polysilicon spacer since oxide does not appreciably grow on neighboring nitride of the etch stop. Oxide is removed separate from and in addition to polysilicon removal without affecting the substrate or gate conductor due to nitride present beneath and adjacent to the polysilicon spacer.

According to an alternative embodiment, implantion occurs at increasing concentrations and energies during the additive formation of the multi-layer sidewall structure. Specifically, an LDD implant occurs prior to forming the etch stop. After the etch stop is formed, another implant can occur similar to implants which occur after forming polysilicon on sidewall surfaces of the etch stop and oxide on sidewall surfaces of the polysilicon. In this embodiment, the first implant is the LDD implant, the intermediate implants are MDD implants, and the final implant is a source/drain implant.

Broadly speaking, the present invention contemplates an integrated circuit. The integrated circuit comprises a transistor having a gate conductor dielectrically spaced over a channel area. The channel area is interposed between a pair of junction areas. An etch stop layer is formed upon opposing sidewall surfaces of the gate conductor and also across a pair of junction areas. The etch stop preferably comprises a layer of oxide and a layer of nitride upon the oxide. A multi-layer spacer is positioned upon the etch stop layer proximate to the opposed sidewall surfaces. At least a pair of differing concentration implants are positioned within the pair of junction areas. One of the pair of implants is placed in lateral alignment with the gate conductor sidewall surfaces, and the other of the pair of implants is placed in lateral alignment with the multi-layer spacer.

One of the pair of differing concentration implants is preferably an LDD implant, whereas the other implant is preferably a source/drain implant. The LDD implant is placed in lateral alignment with the gate conductor sidewall surfaces, and the source/drain implant is placed in lateral alignment with the spacer. Thus, the LDD implant uses only the gate conductor as a mask; however, the source/drain implant uses both the gate conductor and the spacer as a mask. According to one embodiment, the LDD implant occurs before the spacer is formed and therefore before the source/drain implant occurs. According to an alternative embodiment, the LDD implant occurs after the source/drain implant and after the spacer is removed.

The present invention further contemplates a method for forming a transistor. The method comprises the steps for providing a gate dielectric layer interposed between a semiconductor substrate and a layer of polysilicon. Select regions of the layer of polysilicon and the gate dielectric are removed to create a gate conductor dielectrically spaced upon the semiconductor substrate between openings to the semiconductor substrate. A dual layer etch stop is then formed upon the gate conductor and the semiconductor substrate within the openings. A layer of spacer material is then deposited across the entire etch stop. While retaining the dual layer etch stop, the layer of spacer material is removed along substantially horizontal surfaces faster than substantially vertical surfaces to create a spacer which abuts with a region of the etch stop proximate to a pair of opposing sidewall surfaces of the gate conductor.

BRIEF DESCRIPTION OF THE DRAWINGS

Other objects and advantages of the invention will become apparent upon reading the following detailed description and upon reference to the accompanying drawings in which.

Figure 1:
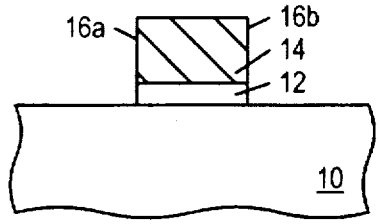
FIG. 1 is a partial cross-sectional view of a semiconductor topography having a gate conductor formed a dielectric distance above a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 illustrates a partial cross-sectional view of a semiconductor substrate 10, preferably made of single crystalline silicon. Deposited entirely across substrate 10 is a dielectric 12 where the dielectric is either deposited or grown from a heated, oxygen-bearing source. Deposited upon oxide 12 is a gate conductor material 14, preferably made of polycrystalline silicon which is rendered conductive by a subsequent implanting step. Gate conductor 14 and underlying gate dielectric 12 are patterned using well-known lithography techniques. The patterned structure resides in an active region which encompasses exposed regions of substrate 10 residing on opposite sides of a channel beneath gate conductor 14. The exposed regions are herein referred to as junction regions.

Gate dielectric 12 is preferably formed in a thermal oxidation furnace using temperatures of approximately 700° to 900° C. for a relatively short (e.g., less than 60 minutes) time. It is preferred that gate dielectric 12 be grown to a thickness of approximately 15–200 angstroms. Gate conductor 14 is deposited upon gate dielectric 12 and patterned between opposing sidewall surfaces 16a and 16b. The polysilicon layer is preferably deposited using a low pressure chemical vapor deposition ("CVD") process, and then patterned using an expose, develop and etch sequence.

Figure 2:
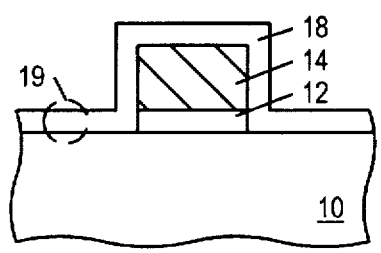
FIG. 2 is a partial cross-sectional view of the semiconductor topography according to a processing step subsequent to FIG. 1, wherein an etch stop layer is formed on the gate conductor and semiconductor substrate.

Referring to FIG. 2, a processing step subsequent to FIG. 1 is shown. Specifically, FIG. 2 illustrates an etch stop layer 18 formed on the exposed topography comprising substrate 10, gate conductor 14 and sidewall surfaces of gate dielectric 12. According to one embodiment, etch stop 18 comprises thermally grown oxide which forms upon and slightly into polysilicon gate conductor 14 as well as silicon substrate 10. Thereafter, the grown oxide is capped with a deposited silicon nitride. Accordingly, etch stop 18 comprises multiple dielectric layers preferably comprising a grown oxide followed by a deposited nitride. The oxide grown upon and into polysilicon gate conductor 14 as well as substrate 10 may be formed in a thermal oxidation furnace using temperatures of approximately 700°–900° C. In alternative embodiments, etch stop 18 may comprise a chemical vapor deposited ("CVD") nitride overlying a CVD oxide, both of which have dissimilar etch characteristics compared to gate conductor 14.

Figure 19:
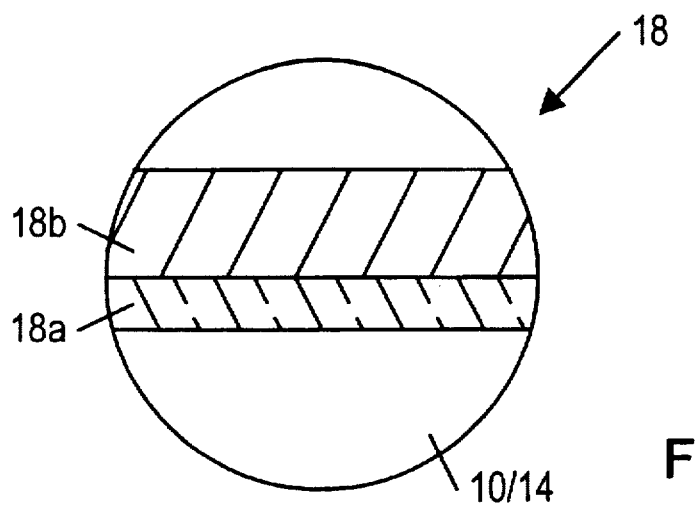
FIG. 19 is a detailed view of a dual layer etch stop along area 19 of FIGS. 2 and 12.

The dual layer etch stop 18 is shown in further detail in reference to FIG. 19. FIG. 19 depicts etch stop 18 as having an oxide layer 18a and a nitride layer 18b. Oxide 18a is deposited or grown to a thickness of approximately 100 to 200 angstroms. Oxide 18a serves as a pad or "buffer" between the mechanical stresses exhibited by the underlying silicon-based substrate (or polysilicon gate conductor) and the overlying nitride layer 18b. The desired 100 to 200 angstroms serves to buffer differences between compressive and tensile stresses. It is necessary that the thickness of oxide 18a be not too thick as would cause the ensuing spacer to be unduly large and the space between source/drains and the channel to be unduly large. All that is required, however, is that the thickness be sufficient to buffer the transition of stresses between a partial or complete silicon lattice structure and a subsequently deposited nitride. Nitride 18b is of sufficient thickness to prevent etch through, a suitable thickness being approximately 200 to 400 angstroms. Nitride 18b is preferably deposited from a CVD chamber.

Figure 3:
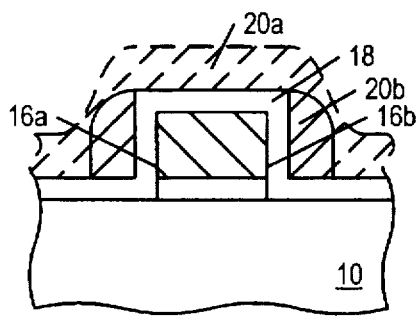
FIG. 3 is a partial cross-sectional view of the semiconductor topography according a processing step subsequent to FIG. 2, wherein a polysilicon spacer is formed on the substantially vertical surfaces of the etch stop proximate to the gate conductor.

FIG. 3 illustrates deposition of a partially sacrificial material 20a. Material 20a preferably comprises polysilicon deposited from a CVD apparatus. Material 20a is deposited across the entire semiconductor topography to form a conformal layer. Material 20a comprises any material which can accommodate subsequent oxide growth and which has dissimilar etch characteristics compared to etch stop 18. After deposition, material 20a undergoes an anisotropic etch. Anisotropic etch is designed as a plasma etch employing both physical and chemical removal mechanisms. Ions are bombarded at an angle substantially perpendicular to the upper surface of substrate 10. This causes substantially horizontal surfaces to be removed faster than substantially vertical surfaces. Accordingly, anisotropic etching removes a portion of material 20a, that portion existing over horizontal surfaces of etch stop 18 and over horizontal surfaces of substrate 10 removed a spaced distance from gate conductor 14. The only regions of material 20a which remain are those regions near substantially vertical surfaces (i.e., regions adjacent sidewall surfaces 16a and 16b of gate conductor 14). The remaining regions of material 20a are henceforth referred to as polysilicon spacers 20b.

Figure 20:
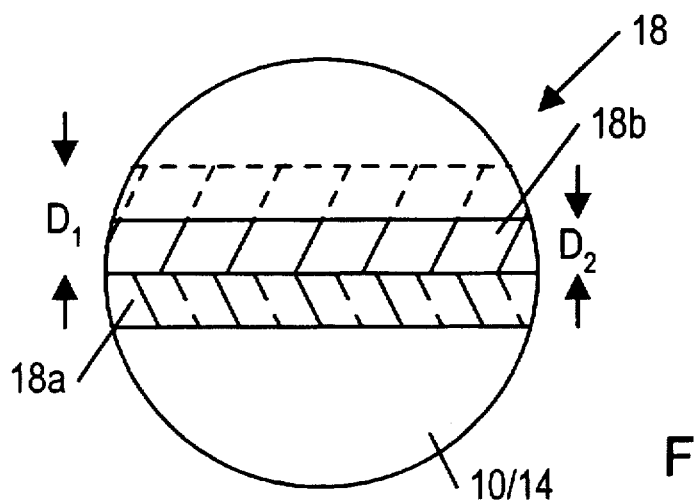
FIG. 20 is a detailed view of the nitride layer within the etch stop partially but not entirely removed as a result of polysilicon spacer overetch shown in FIGS. 3 and 13.

FIG. 20 depicts the effect of anisotropic etch upon etch stop layer 18. To clear material 20a (shown in FIG. 3) from horizontal surfaces, it is necessary to overetch that material. A result of overetch is a slight removal of nitride 18b as shown in FIG. 20. Removal, however, is slight since the anisotropic etch rate of nitride is substantially lower than the overlying polysilicon material 20a. FIG. 20 shows a reduction in nitride 18b height from $D_1$ to $D_2$. Thickness $D_2$ remains so that the overetch does not penetrate through nitride 18b.

Figure 4:
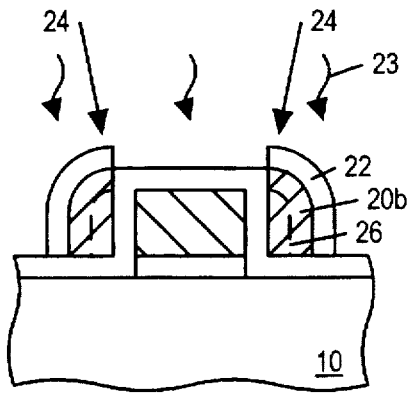
FIG. 4 is a partial cross-sectional view of the semiconductor topography according to a processing step subsequent to FIG. 3, wherein an oxide is grown on exposed surfaces of the polysilicon spacer to form a multi-layer spacer structure.

A final layer 22 of a multi-layer spacer structure 24 is formed on polysilicon spacer 20b, as shown in FIG. 4. Layer 22 is preferably a layer which is grown by exposing polysilicon spacer 20b to elevated temperatures 23 in the presence of an oxygen bearing ambient. Accordingly, layer 22 is preferably an oxide layer which, as it grows, extends outward from polysilicon spacer 20b and inward into polysilicon spacer 20b according to dashed lines 26. Depending upon the relative densities and molecular weights of silicon and silicon dioxide, it is found that the amount of silicon within substrate 10 and polysilicon 20b being consumed is between 40% to approximately 50% of the final oxide thickness. The amount of polysilicon being consumed (or converted to oxide) is important with respect to forming a subsequent spacer lateral boundary, the benefit of which is set forth below.

Figure 5:
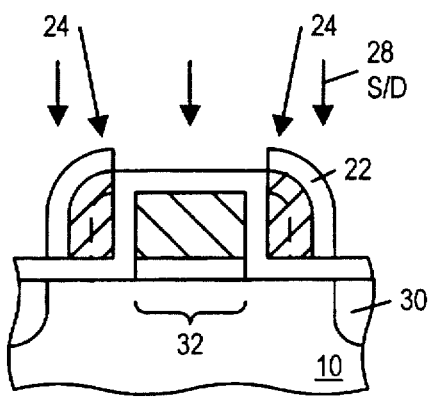
FIG. 5 is a partial cross-sectional view of the semiconductor topography according to a processing step subsequent to FIG. 4, wherein the multi-layer spacer serves to mask a portion of each junction from source/drain implant.

FIG. 5 illustrates multi-layer spacer 24 used as a mask for source/drain implant. Source/drain implant comprises any n-type or p-type dopant species forwarded at approximately perpendicular angles (preferably 7° from perpendicular) to the upper surface of substrate 10. Dopant species of implant 28, relatively speaking, are placed at fairly high concentrations and implant energies to form source/drain regions 30 within corresponding junctions a spaced distance from a channel 32.

Figure 6:
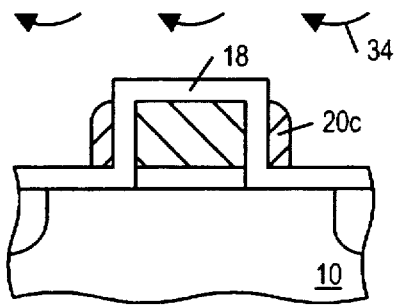
FIG. 6 is a partial cross-sectional view of the semiconductor topography according to a processing step subsequent to FIG. 5, wherein the oxide and a portion of the consumed polysilicon are removed.

FIG. 6 illustrates removal of oxide 22 from multi-layer spacer 24. Preferably, removal is achieved by a wet etch process 34 using, for example, various well known oxide removal solutions. The solution chosen is one which removes silicon dioxide with high selectivity against removal of underlying, nitride etch stop 18 and underlying, retained portion 20c of polysilicon spacer 20b. The retained portion 20c of polysilicon spacer 20b is that portion not consumed during oxide growth.

Removing oxide 22 and the consumed portion of polysilicon 20b does not impact upon source/drain areas 30 underlying etch stop 18. For the same reason that etch stop 18 prevents pitting and charging of the underlying substrate during anisotropic removal of polysilicon material 20a (shown in FIG. 3), etch stop 18 also prevents damage to underlying substrate during oxide removal (shown in FIG. 6). Etch stop 18 and, more specifically, nitride 18b serves as a protectant during the etch steps used to (i) pattern polysilicon spacer 20b and (ii) thereafter remove oxide 22 from spacer 20b. So as to maintain the integrity of the source/drain areas as well as the gate conductor, it is important to protect those areas against ion bombardment (i.e., pitting and charging) and to prevent contaminants from entering those regions during plasma/wet etch removal of the various overlying thin films. Those contaminants can arise from the etch species or from the films being removed. Any charging, pitting or contamination of the source/drain or gate conductor surfaces may cause an inferior ohmic contact thereto, sub-par source/drain performance, possible junction "spiking", and/or junction breakdown, etc.

Figure 7:
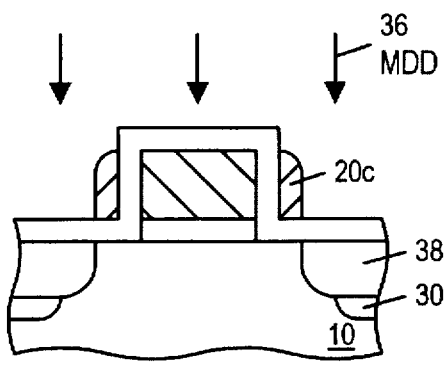
FIG. 7 is a partial cross-sectional view of the semiconductor topography according to a processing step subsequent to FIG. 6, wherein the remaining polysilicon serves to mask a portion of each junction from an MDD implant.
Figure 8:
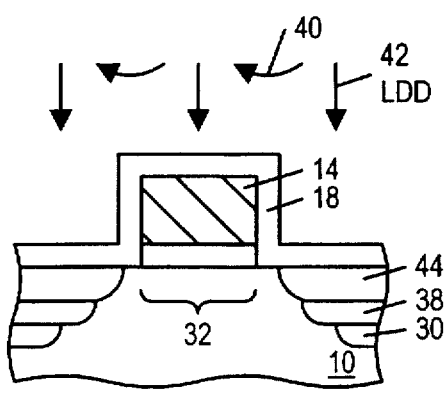
FIG. 8 is a partial cross-sectional view of the semiconductor topography according to a processing step subsequent to FIG. 7, wherein the remaining polysilicon (possibly in combination with the etch stop) is removed to provide a mask for an LDD implant.
Figure 21:
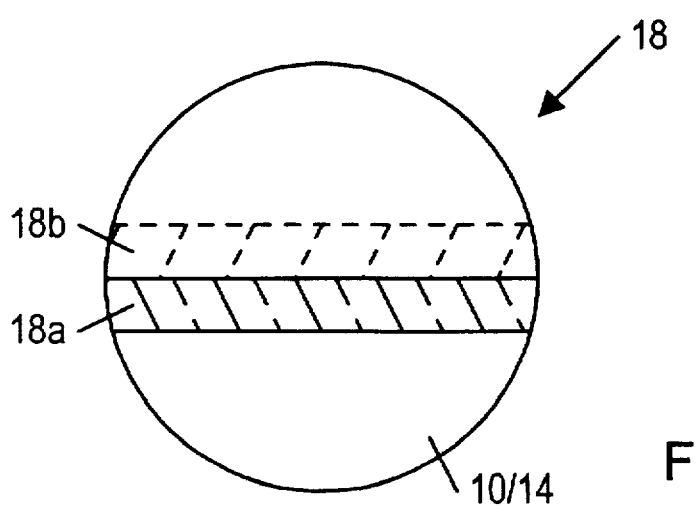
FIG. 21 is a detailed view of the nitride layer within the etch stop entirely removed, followed by oxide layer partially if not entirely removed, as a result of removing the etch stop, if desired, according to the steps shown in FIGS. 9 and 17.

FIG. 7 depicts remaining polysilicon spacer 20c used as a mask against MDD implant 36. MDD implant 36 is of the same dopant species as source/drain implant 28 but utilizes lower concentrations and energies to form MDD area 38. FIG. 8 illustrates two steps subsequent to FIG. 7. First, remaining polysilicon spacer 20c is removed using a wet etch solution selective to polysilicon as opposed to the underlying etch stop 18, a suitable etch stop being silicon nitride. The etch step is shown as reference numeral 40. Secondly, once polysilicon spacer 20c is removed, an another MDD implant can occur or, alternatively, an LDD implant 42 occurs. LDD implant 42 is of the same dopant species as source/drain implant 28 and MDD implant 36, albeit at lower concentrations and energy than the source/drain and MDD implants. Resulting from LDD implant 42, an LDD area 44 is produced. According to an alternative embodiment, both polysilicon 20cand etch stop 18 are removed in two successive etch steps, leaving sidewall surfaces 16aand 16b intact. FIG. 21 illustrates sequential removal of etch stop 18. First, the remaining nitride layer 18b is removed, followed by removal of oxide 18a. The etchant used to remove nitride 18b is dissimilar from that used to remove oxide 18a. Those etchants are applied in sequence, possibly with an interim clean step incorporated into the removal sequence. Sidewall surfaces 16a and 16b, and more specifically, the remaining gate conductor 14 serve to align LDD implant 42 adjacent to channel 32. As such, removal of both polysilicon spacer 20c and etch stop 18 allows LDD area 44 to be placed closer to channel 32, than that shown in FIG. 8.

Figure 9:
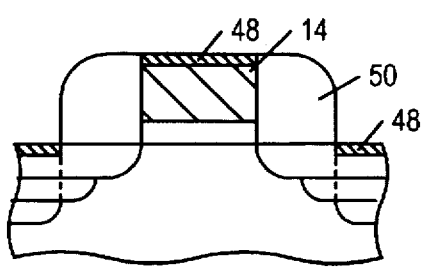
FIG. 9 is a partial cross-sectional view of the semiconductor topography according to a processing step subsequent to FIG. 8, wherein a salicide is formed on exposed gate conductor and junction upper surfaces.

FIG. 9 depicts salicidation of exposed silicon based surfaces. Specifically, FIG. 9 depicts a salicide process in which a salicide/polycide 48 is formed in the junctions and polysilicon surfaces of the ensuing NMOS or PMOS transistor. The salicide results from depositing a refractory metal on the exposed semiconductor topography. The metal undergoes a two-step anneal process. The first anneal cycle causes a first phase reaction. All non-reacted metal is removed except in regions where the silicon atoms are prevalent. As such, regions between silicon-rich areas, i.e., serve to prevent silicide growth. Those regions are denoted as oxide 50 formed on sidewall surfaces of gate conductor 14. Oxide 50 is formed after LDD implant is concluded. Thus, the second anneal step causes a second phase reaction of refractory metal only in silicon based junctions and possibly on the upper surfaces of the polysilicon gate conductor 14. The silicide serves to enhance conductivity of subsequent metalization layers drawn to the junctions. For sake of brevity and clarity of the drawings, the silicide formation steps and subsequent metalization layers are not shown. However, it is to be understood an integrated circuit which utilizes the present process will have subsequent fabrication steps involving interlevel dielectrics and one or more layers of metalization.

FIGS. 1–9 illustrate a processing sequence in which multi-level spacer structure 24 is formed. Thereafter, outermost layers of that structure are removed in sequence, followed by a respective implant step. At least three implants can occur by removing three separate layers from multi-layer spacer 24. Those implants are defined as a heavier concentration source/drain implant, followed by medium concentration MDD implants and lastly followed by a lighter concentration LDD implant. FIGS. 10–18 depict an alternate processing sequence to that of FIGS. 1–9. Specifically, FIGS. 10–18 illustrate implant of LDD, followed by MDD implant, and finally followed by source/drain implant during the layer-by-layer additive formation of a multi-layer spacer structure. Thus, instead of implanting after subtractive removal of layers, FIGS. 10–18 illustrate implant during layer-by-layer addition.

Figure 10:
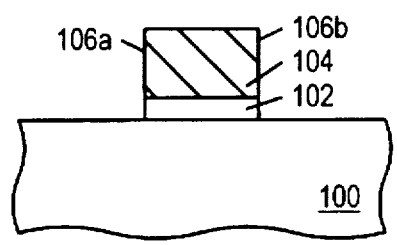
FIG. 10 illustrates an initial processing step of an alternate processing sequence to that of FIGS. 1–9.

Referring to FIG. 10, a partial cross-sectional view of semiconductor substrate 100 is shown at a processing step according to an alternative embodiment. Formed upon substrate 100 is a patterned gate dielectric 102 and a gate conductor 104, similar to the sequence used in FIG. 1. Gate conductor 104 is defined between sidewall surfaces 106a and 106b.

Figure 11:
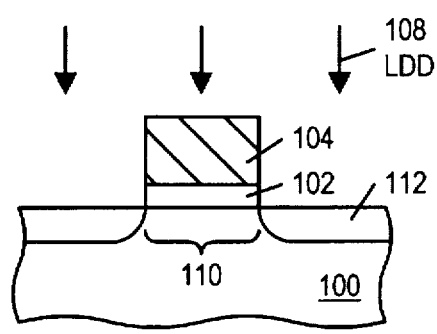
FIG. 11 is a partial cross-sectional view of the semiconductor topography according to a processing step subsequent to FIG. 10, wherein the gate conductor serves to align an LDD implant into each junction within the semiconductor substrate.
Figure 12:
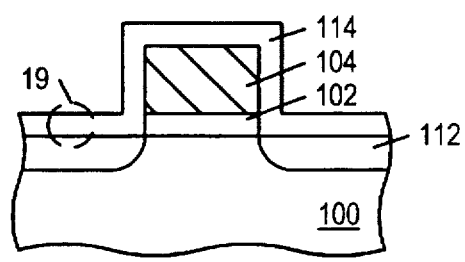
FIG. 12 is a partial cross-sectional view of the semiconductor topography according to a processing step subsequent to FIG. 11, wherein an etch stop layer is formed on the gate conductor and semiconductor substrate.

In a processing step subsequent to FIG. 10, FIG. 11 illustrates an LDD implant 108 into substrate 100. Gate conductor 104 and gate dielectric 102 serve to mask implant 108 from channel region 110 to form LDD areas 112. FIG. 12 illustrates formation of an etch stop layer 114 upon the exposed topography comprising gate conductor 104, gate dielectric 102 and substrate 100. Similar to etch stop 18, etch stop 114 may comprise a singular dielectric layer or multiple dielectric layers, preferably including a nitride layer upper surface layer. Etch stop 114 is formed at a thickness sufficient to provide proper coverage of all exposed surfaces and also to preclude etching through the etch stop when the overlying material is being removed. Conversely, etch stop 114 need not be too thick as to make it time consumptive to remove (if needed).

Figure 13:
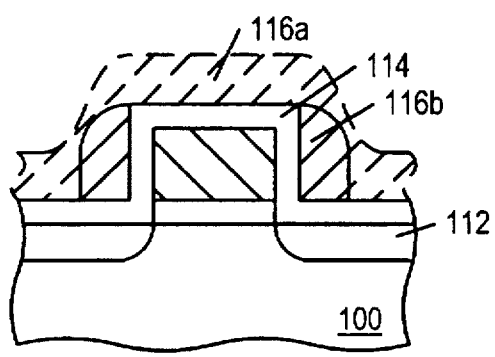
FIG. 13 is a partial cross-sectional view of the semiconductor topography according to a processing step subsequent to FIG. 12, wherein a polysilicon spacer is formed on the substantially vertical surfaces of the etch stop proximate to the gate conductor.

FIG. 13 illustrates formation of a polysilicon spacer 116b from a deposited polysilicon material 116a. Formation of polysilicon spacer 116b is similar to the step shown in FIG. 3 to produce polysilicon spacer 20b.

Figure 14:
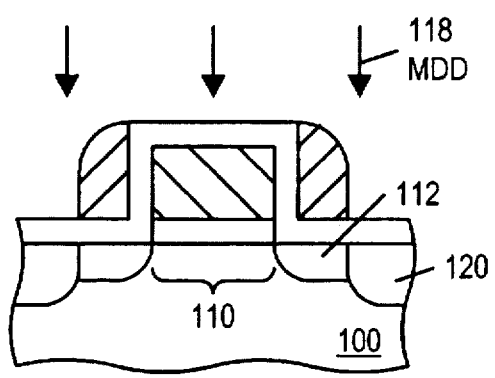
FIG. 14 is a partial cross-sectional view of the semiconductor topography according to a processing step subsequent to FIG. 13, wherein a polysilicon spacer and etch stop serve to mask a portion of each junction from an MDD implant.
Figure 15:
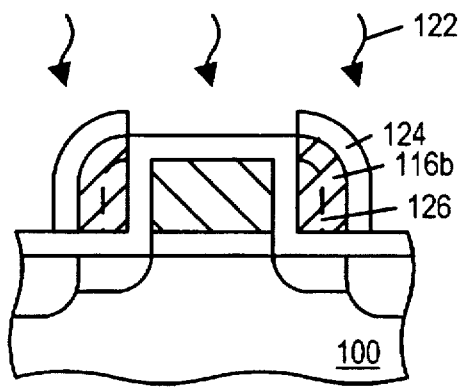
FIG. 15 is a partial cross-sectional view of the semiconductor topography according to a processing step subsequent to FIG. 14, wherein an oxide is grown on exposed surfaces of the polysilicon spacer to form a multi-layer spacer structure.

FIG. 14 depicts an MDD implant 118 forwarded into junctions of substrate 100. MDD implant 118 is masked a spaced distance from channel region 110 to form MDD area 120. Relatively speaking, MDD implant 118 is of higher concentration and implant energy than LDD implant 108. FIG. 15 illustrates oxidation 122 of polysilicon spacer 116b to form an oxide layer 124. Similar to the steps shown in FIG. 4, oxide 124 consumes the upper and outer exposed surfaces of polysilicon spacer 116b to define an inward or lower boundary 126 of oxide 124.

Figure 16:
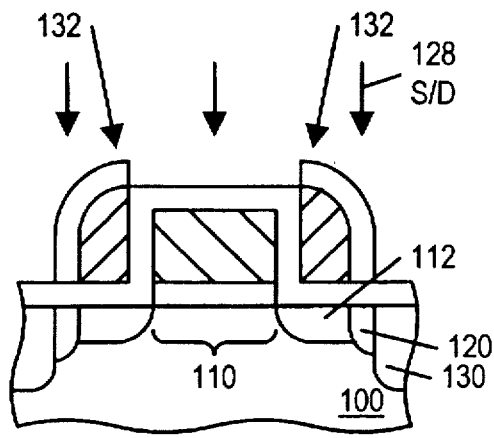
FIG. 16 is a partial cross-sectional view of the semiconductor topography according to a processing step subsequent to FIG. 15, wherein the multi-layer spacer structure serves to mask a portion of each junction from a source/drain implant.

FIG. 16 illustrates a source/drain implant 128. Source/drain implant 128 is of higher concentration and implant energy than either LDD implant 108 or MDD implant 118. Source/drain implant 128 forms a source/drain region 130 a spaced distance from channel 110 in accordance with the masking provided by a multi-layer spacer structure 132. The source/drain implant 128 therefore parallels the step shown in FIG. 5 except that LDD and MDD implant areas 112 and 120, respectively, pre-exist.

Figure 17:
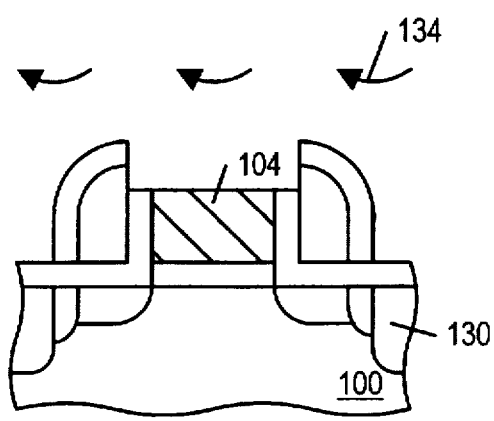
FIG. 17 is a partial cross-sectional view of the semiconductor topography according to a processing step subsequent to FIG. 16, wherein exposed portions of the etch stop may be removed.

FIG. 17 illustrates, according to one embodiment, removal 134 of exposed etch stop layer 114 from source/drain regions 130 of corresponding junctions and from the upper surface of gate conductor 104. Removing the etch stop layer affords salicidation of the exposed silicon-bearing surfaces in accordance with that shown in FIG. 18. The salicidation process produces suicide and polycide regions 136 denoted in FIG. 18. The multi-layer spacer structure 132 serves to prevent silicide formation between the junction and gate conductor regions, and therefore prevents the bridging problems.

Figure 18:
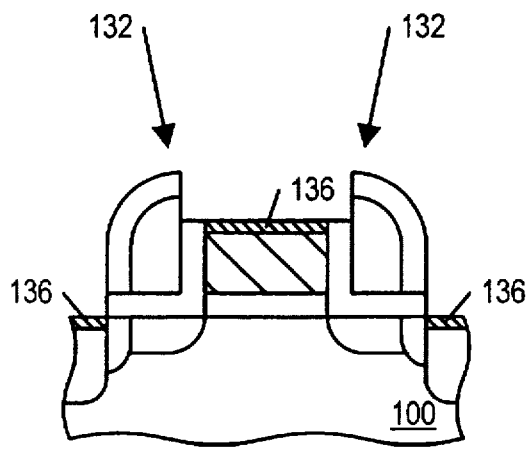
FIG. 18 a partial cross-sectional view of the semiconductor topography according to a processing step subsequent to FIG. 17, wherein a salicide is formed on exposed gate conductor and junction upper surfaces.

Silicide 136 is formed in accordance with a two step process described in reference to FIG. 9. The benefit of the processing sequence culminating in FIG. 18 is that of pre-existing spacer structure 132. Spacer 132 serves to prevent silicide growth thereon, whereas if the multi-layer spacer is remove in accordance with the processing step culminating in FIG. 9, then a spacer must be re-formed to prevent silicide bridging. That spacer is shown in FIG. 9 as reference numeral 50.

Regardless of which processing sequence is chosen, the end result remains the same, which is to produce junctions on opposing sides of a channel having highly graded doping profiles. Those junctions are graded by utilizing the benefits of a polysilicon spacer which is partially consumed and therefore partially removed in processing steps which are easier to instill than conventional spacer deposition steps. Accordingly, the present process takes advantage of self-aligned oxidation rather than separate deposition and anisotropic etch back techniques. Oxidation is more easily and readily formed than deposition and etch back and, more importantly, provides a resource for subsequent partial removal. Removal is also self-aligned to provide another sidewall surface to which a further MDD implant is masked. Therefore, not only is the present multi-layer spacer structure more readily formed, but also beneficially provides more laterally displaced junction implant areas than conventional spacers and junction implants.

It will be appreciated to those skilled in the art having the benefit of this disclosure that the present processing sequences are believed to be capable of forming junctions with a smooth doping profile and, furthermore, for performing the LDD implants either first or last in a sequence. If the LDD implants are performed last, then an anneal of the earlier source/drain and MDD implant can be performed at higher temperatures to avoid excessive migration of the subsequent, temperature sensitive LDD implant areas. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for forming a transistor, comprising:
providing a gate dielectric layer interposed between a semiconductor substrate and a layer of polysilicon;
removing select regions of said layer of polysilicon and said gate dielectric to create a gate conductor dielectrically spaced upon said semiconductor substrate between openings to said semiconductor substrate;
forming a dual layer etch stop upon the gate conductor and the semiconductor substrate within said openings;
depositing a layer of spacer material across the entire said etch stop; and
while retaining said dual layer etch stop, removing the layer of spacer material along substantially horizontal surfaces faster than substantially vertical surfaces to create a spacer which abuts with a region of said etch stop proximate to a pair of opposed sidewall surfaces of said gate conductor.

2. The method as recited in claim 1, wherein said removing comprises etching the layer of spacer material at a substantially faster rate than an upper layer of said dual layer etch stop.

3. The method as recited in claim 2, wherein the upper layer comprises nitride residing upon a lower layer of said dual layer etch stop.

4. The method as recited in claim 3, wherein the lower layer comprises oxide.

5. The method as recited in claim 1, wherein said forming the dual layer etch stop comprises:
depositing, to a first thickness, a layer of oxide upon the gate conductor and the semiconductor substrate within said openings; and
depositing a layer of nitride upon the layer of oxide to a second thickness approximately twice the first thickness.

6. The method as recited in claim 5, wherein said first thickness is' in the range of approximately 100 to 200 angstroms.

7. The method as recited in claim 5, wherein said second thickness is in the range of approximately 200 to 400 angstroms.

8. The method as recited in claim 1, wherein said forming the dual layer etch stop comprises:
growing, to a first thickness, a layer of oxide upon the gate conductor and the semiconductor substrate within said openings; and
depositing a layer of nitride upon the layer of oxide to a second thickness approximately twice the first thickness.

9. The method as recited in claim 8, wherein said first thickness is in the range of approximately 100 to 200 angstroms.

10. The method as recited in claim 8, wherein said second thickness is in the range of approximately 200 to 400 angstroms.

11. The method as recited in claim 1, further comprising:
implanting a first concentration of dopants into said semiconductor substrate prior to the step of forming a dual layer etch stop; and
implanting a second concentration of dopants greater than the first concentration into said semiconductor substrate after the step of removing the layer of spacer material.

12. The method as recited in claim 11, wherein implanting the first concentration of dopants comprises using the gate conductor as a mask against implant of said first concentration of dopants.

13. The method as recited in claim 11, wherein implanting the second concentration of dopants comprises using the gate conductor and the spacer as a mask against implant of said second concentration of dopants.

14. The method as recited in claim 1, further comprising:
while using the spacer and the gate conductor as a mask implanting a relatively heavy concentration of dopants into the semiconductor substrate;
removing said spacer from said etch stop;
removing said etch stop from said gate conductor and said semiconductor substrate; and while using only the gate conductor as a mask implanting a relatively light concentration of dopants into the semiconductor substrate.

15. An integrated circuit, comprising:

a transistor gate conductor dielectrically spaced above a semiconductor substrate;

a dielectric etch stop structure comprising a substantially vertical portion and a substantially horizontal portion, wherein said substantially vertical portion extends along a sidewall surface of said gate conductor and said substantially horizontal portion extends along an upper surface of said semiconductor substrate outward from said sidewall surface; and a pair of spacer structures, each arranged adjacent an exposed vertical sidewall of said vertical portion and upon an exposed upper surface of said horizontal portion, wherein each spacer structure comprises a polysilicon portion and an oxide portion, and wherein an upper surface of said spacer structure is at a higher elevation level than an upper surface of said gate conductor.

16. The integrated circuit as recited in claim 15, wherein said gate conductor comprises polysilicon.

17. The integrated circuit as recited in claim 15, wherein said etch stop structure comprises a silicon nitride layer.

18. The integrated circuit as recited in claim 17, wherein said etch stop structure further comprises a silicon dioxide layer, and wherein said silicon nitride layer is arranged adjacent an exposed lateral surface of and upon an exposed upper surface of said silicon dioxide layer.

19. The integrated circuit as recited in claim 15, wherein said oxide portion is adjacent an exposed lateral surface of said polysilicon portion.

20. The integrated circuit as recited in claim 15, further comprising impurity distributions within said semiconductor substrate, laterally disposed on either side of said gate conductor and self-aligned to said sidewall surfaces of said gate conductor.

21. The integrated circuit as recited in claim 15, further comprising impurity distributions within said semiconductor substrate, laterally disposed on either side of said gate conductor and self-aligned to exposed lateral surfaces of said spacer structures.

22. The integrated circuit as recited in claim 15, further comprising impurity distributions within said semiconductor substrate, laterally disposed on either side of said gate conductor and self-aligned to surfaces existing between said exposed lateral surfaces of said spacer structures and said sidewall surfaces of said gate conductor.

23. The integrated circuit as recited in claim 22, wherein said surfaces existing between comprise substantially vertical interfaces between said etch stop and said polysilicon portion.

24. The integrated circuit as recited in claim 22, wherein said surfaces existing between comprise substantially vertical interfaces between said polysilicon portion and said oxide portion.

* * * * *